(12) United States Patent
Van Der Wijst et al.

(10) Patent No.: US 7,436,484 B2
(45) Date of Patent: Oct. 14, 2008

(54) LITHOGRAPHIC APPARATUS AND DEVICE MANUFACTURING METHOD

(75) Inventors: Marc Wilhelmus Maria Van Der Wijst, Veldhoven (NL); Dominicus Jacobus Petrus Adrianus Franken, Veldhoven (NL); Erik Roelof Loopstra, Heeze (NL); Marius Ravensbergen, Bergeijk (NL)

(73) Assignee: ASML Netherlands B.V., Veldhoven (NL)

( * ) Notice: Subject to any disclaimer, the term of this patent is extended or adjusted under 35 U.S.C. 154(b) by 231 days.

(21) Appl. No.: 11/022,936

(22) Filed: Dec. 28, 2004

(65) Prior Publication Data

US 2006/0139585 A1 Jun. 29, 2006

(51) Int. Cl.
*G03B 27/68* (2006.01)
*G03B 27/42* (2006.01)

(52) U.S. Cl. .......................... 355/52; 355/53
(58) Field of Classification Search ............ 355/52, 355/53, 55; 359/819–820, 847
See application file for complete search history.

(56) References Cited

U.S. PATENT DOCUMENTS

| | | | |
|---|---|---|---|
| 6,198,579 B1 | 3/2001 | Rupp | 359/820 |
| 6,307,688 B1 | 10/2001 | Merz et al. | 359/819 |
| 6,388,823 B1 | 5/2002 | Gaber et al. | 359/819 |
| 6,897,940 B2 * | 5/2005 | Sogard | 355/55 |
| 2003/0007236 A1 | 1/2003 | Schachar | |
| 2003/0081193 A1 | 5/2003 | White | |
| 2003/0234918 A1 * | 12/2003 | Watson | 355/53 |
| 2004/0008419 A1 | 1/2004 | Schachar | 359/666 |
| 2004/0144915 A1 | 7/2004 | Wagner et al. | 250/216 |
| 2004/0257683 A1 | 12/2004 | Petasch et al. | 359/847 |
| 2006/0132733 A1 | 6/2006 | Modderman | 355/53 |

FOREIGN PATENT DOCUMENTS

WO   WO 03/098350 A2   11/2003
WO   WO 2004/036316 A1   4/2004

OTHER PUBLICATIONS

European Search Report for European Application No. 05257742.6, dated Nov. 27, 2006.
Australian Search Report and Written Opinion for Singapore Application No. SG 200508312-6, dated Oct. 30, 2006.
Official Notification of the IPO (Translation), dated Apr. 18, 2007.
Notice of Reasons for Rejection for Japanese Patent Application No. 2005-375313 dated Jun. 10, 2008.

* cited by examiner

*Primary Examiner*—Hung Henry Nguyen
(74) *Attorney, Agent, or Firm*—Pillsbury Winthrop Shaw Pittman, LLP

(57) ABSTRACT

A lithographic apparatus is disclosed having a deformable lens element through which a patterned radiation beam is arranged to pass before reaching a substrate and having a deformable lens actuator configured to transmit a combination of a force substantially parallel to the optical axis of the projection system and a localized torque about an axis substantially perpendicular to the optical axis independently at a plurality of sub-regions on the deformable lens element.

17 Claims, 16 Drawing Sheets

Fig. 3

ASML Veldhoven definitions "Fringe Zernike Polynomials"

| Number | Polynomial | Radial order (n) | Azimuth order (l) |
|---|---|---|---|
| 1 | 1 | 0 | 0 |
| 2 | $r \cdot \cos(\theta)$ | 1 | 1 |
| 3 | $r \cdot \sin(\theta)$ | 1 | 1 |
| 4 | $2 \cdot r^2 - 1$ | 2 | 0 |
| 5 | $r^2 \cdot \cos(2 \cdot \theta)$ | 2 | 2 |
| 6 | $r^2 \cdot \sin(2 \cdot \theta)$ | 2 | 2 |
| 7 | $(3 \cdot r^3 - 2 \cdot r) \cdot \cos(\theta)$ | 3 | 1 |
| 8 | $(3 \cdot r^3 - 2 \cdot r) \cdot \sin(\theta)$ | 3 | 1 |
| 9 | $6 \cdot r^4 - 6 \cdot r^2 + 1$ | 4 | 0 |
| 10 | $r^3 \cdot \cos(3 \cdot \theta)$ | 3 | 3 |
| 11 | $r^3 \cdot \sin(3 \cdot \theta)$ | 3 | 3 |
| 12 | $(4 \cdot r^4 - 3 \cdot r^2) \cdot \cos(2 \cdot \theta)$ | 4 | 2 |
| 13 | $(4 \cdot r^4 - 3 \cdot r^2) \cdot \sin(2 \cdot \theta)$ | 4 | 2 |
| 14 | $(10 \cdot r^5 - 12 \cdot r^3 + 3 \cdot r) \cdot \cos(\theta)$ | 5 | 1 |
| 15 | $(10 \cdot r^5 - 12 \cdot r^3 + 3 \cdot r) \cdot \sin(\theta)$ | 5 | 1 |
| 16 | $20 \cdot r^6 - 30 \cdot r^4 + 12 \cdot r^2 - 1$ | 6 | 0 |
| 17 | $r^4 \cdot \cos(4 \cdot \theta)$ | 4 | 4 |
| 18 | $r^4 \cdot \sin(4 \cdot \theta)$ | 4 | 4 |
| 19 | $(5 \cdot r^5 - 4 \cdot r^3) \cdot \cos(3 \cdot \theta)$ | 5 | 3 |
| 20 | $(5 \cdot r^5 - 4 \cdot r^3) \cdot \sin(3 \cdot \theta)$ | 5 | 3 |
| 21 | $(15 \cdot r^6 - 20 \cdot r^4 + 6 \cdot r^2) \cdot \cos(2 \cdot \theta)$ | 6 | 2 |
| 22 | $(15 \cdot r^6 - 20 \cdot r^4 + 6 \cdot r^2) \cdot \sin(2 \cdot \theta)$ | 6 | 2 |
| 23 | $(35 \cdot r^7 - 60 \cdot r^5 + 30 \cdot r^3 - 4 \cdot r) \cdot \cos(\theta)$ | 7 | 1 |
| 24 | $(35 \cdot r^7 - 60 \cdot r^5 + 30 \cdot r^3 - 4 \cdot r) \cdot \sin(\theta)$ | 7 | 1 |
| 25 | $70 \cdot r^8 - 140 \cdot r^6 + 90 \cdot r^4 - 20 \cdot r^2 + 1$ | 8 | 0 |
| 26 | $r^5 \cdot \cos(5 \cdot \theta)$ | 5 | 5 |
| 27 | $r^5 \cdot \sin(5 \cdot \theta)$ | 5 | 5 |
| 28 | $(6 \cdot r^6 - 5 \cdot r^4) \cdot \cos(4 \cdot \theta)$ | 6 | 4 |
| 29 | $(6 \cdot r^6 - 5 \cdot r^4) \cdot \sin(4 \cdot \theta)$ | 6 | 4 |
| 30 | $(21 \cdot r^7 - 30 \cdot r^5 + 10 \cdot r^3) \cdot \cos(3 \cdot \theta)$ | 7 | 3 |
| 31 | $(21 \cdot r^7 - 30 \cdot r^5 + 10 \cdot r^3) \cdot \sin(3 \cdot \theta)$ | 7 | 3 |
| 32 | $(56 \cdot r^8 - 105 \cdot r^6 + 60 \cdot r^4 - 10 \cdot r^2) \cdot \cos(2 \cdot \theta)$ | 8 | 2 |
| 33 | $(56 \cdot r^8 - 105 \cdot r^6 + 60 \cdot r^4 - 10 \cdot r^2) \cdot \sin(2 \cdot \theta)$ | 8 | 2 |
| 34 | $(126 \cdot r^9 - 280 \cdot r^7 + 210 \cdot r^5 - 60 \cdot r^3 + 5 \cdot r) \cdot \cos(\theta)$ | 9 | 1 |
| 35 | $(126 \cdot r^9 - 280 \cdot r^7 + 210 \cdot r^5 - 60 \cdot r^3 + 5 \cdot r) \cdot \sin(\theta)$ | 9 | 1 |
| 36 | $252 \cdot r^{10} - 630 \cdot r^8 + 560 \cdot r^6 - 210 \cdot r^4 + 30 \cdot r^2 - 1$ | 10 | 0 |

Fig. 10
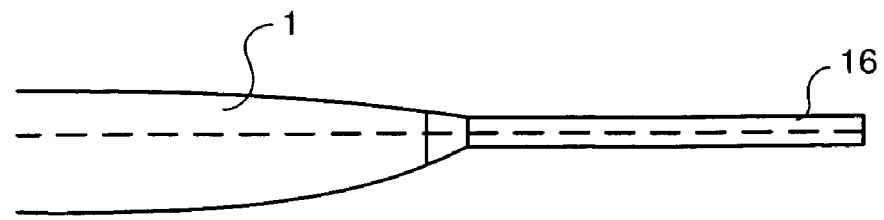
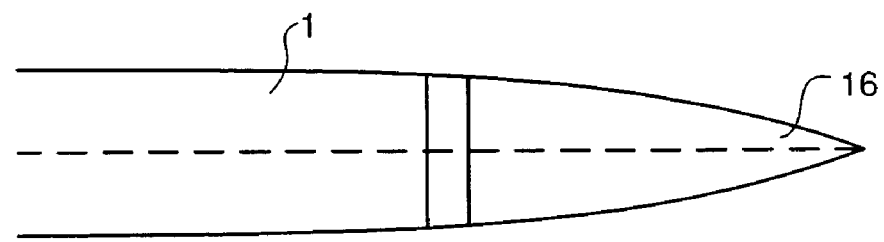
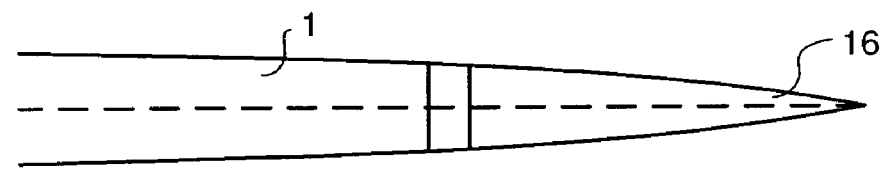
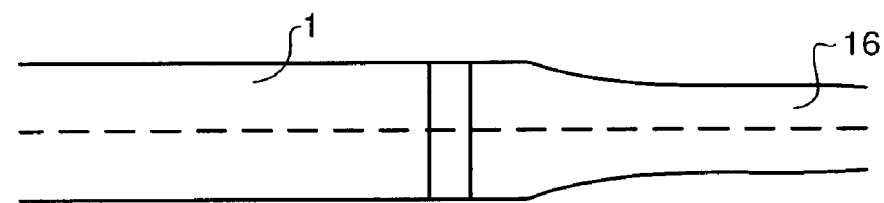
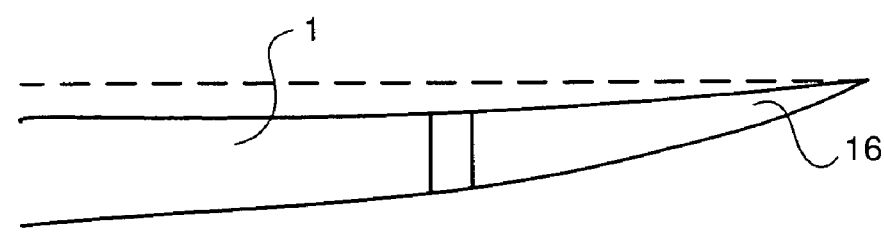

LITHOGRAPHIC APPARATUS AND DEVICE MANUFACTURING METHOD

FIELD

The invention relates to an apparatus comprising a deformable lens element, a method of using a deformable lens element, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Modern high quality optical systems, including those used in lithography apparatus, may use one or more deformable optical elements to correct for aberrations that appear during use, such as those caused by lens heating. Where the deformable element is a transmissive lens element, adjustment of the lens shape may be achieved by manipulation of a peripheral edge of the lens element (so as not to interfere with the path of radiation through the optical system) using out-of-plane forces (perpendicular to the plane of the deformable lens element in question). Aberration levels can be improved using such methods, but only to a limited extent. This is because the degree of precision with which a generalized distortion can be corrected using only out-of-plane forces applied around the edge of the lens element is limited. Better compensation may be achieved using reflective elements where corrective forces can be applied all over the rear side of the element without interfering with the operation of the element. However, it is not always possible to replace all transmissive elements with reflective alternatives.

SUMMARY

Accordingly, it would be advantageous, for example, to improve the level of correction that can be achieved with a transmissive deformable lens element in a lithographic apparatus.

According to an aspect of the invention, there is provided a lithographic apparatus, comprising:

a projection system configured to project a patterned radiation beam onto a target portion of a substrate;

a deformable lens element through which the patterned radiation beam is arranged to pass before reaching the substrate; and a deformable lens actuator configured to control the shape of the deformable lens element, the deformable lens actuator configured to transmit a combination of a force substantially parallel to the optical axis of the projection system and a localized torque about an axis substantially perpendicular to the optical axis independently at a plurality of sub-regions on the deformable lens element.

According to an aspect of the invention, there is provided a lithographic apparatus, comprising:

a projection system configured to project a patterned radiation beam onto a target portion of a substrate;

a deformable lens element through which the patterned radiation beam is arranged to pass before reaching the substrate;

a plurality of magnetic dipoles connected to the deformable lens element and oriented substantially tangentially with respect thereto so as to form a path of alternating north and south poles; and a plurality of magnetic actuators configured to interact with one or more magnetic dipoles of the plurality of magnetic dipoles so as to apply one or more of a tangential bending moment, a radial bending moment, a force with a component substantially parallel to the optical axis of the projection system, or any combination thereof, to a portion of the deformable lens element and thereby change the shape of the deformable lens element.

According to an aspect of the invention, there is provided a device manufacturing method, comprising:

controlling a shape of a deformable lens element by transmitting a combination of a force substantially parallel to the optical axis of the deformable lens element and a localized torque about an axis substantially perpendicular to the optical axis independently at a plurality of sub-regions on the deformable lens element; and projecting a patterned radiation beam through the deformable lens element onto a target portion of a substrate.

According to an aspect of the invention, there is provided a device manufacturing method, comprising:

changing the shape of a deformable lens element by using a plurality of magnetic actuators interacting with one or more magnetic dipoles of a plurality of magnetic dipoles so as to apply a tangential bending moment, a radial bending moment, a force with a component substantially parallel to the optical axis of deformable lens element, or any combination thereof, to a portion of the deformable lens element, the plurality of magnetic dipoles connected to the deformable lens element and oriented substantially tangentially with respect thereto so as to form a path of alternating north and south poles; and projecting a patterned radiation beam through the deformable lens element onto a target portion of a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 is a table showing the definitions of Zernike polynomial used;

FIG. 10 depicts possible cross-sectional forms for the fingers depicted in FIG. 9 for various deformable lens shapes;

DETAILED DESCRIPTION

Figure 1:
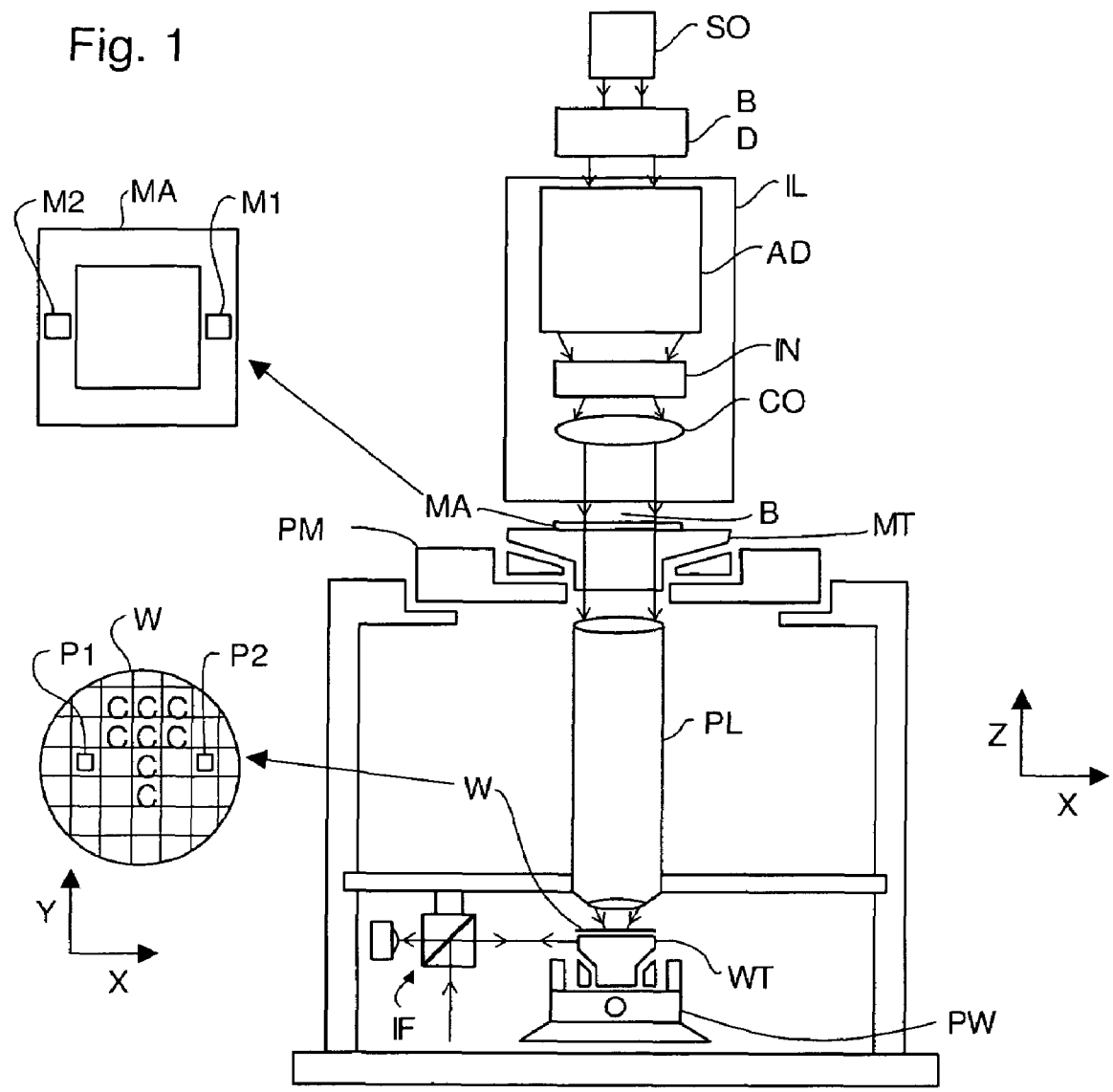
FIG. 1 depicts a lithographic apparatus according to an embodiment of the invention.

FIG. 1 schematically depicts a lithographic apparatus according to an embodiment of the invention. The apparatus comprises:
- an illumination system (illuminator) IL configured to condition a radiation beam B (e.g. UV radiation or EUV/DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As has been mentioned above, image quality in advanced optical systems may be improved by including one or more deformable lens elements. Existing concepts for deformable lens elements tend to be based on the use of out-of-plane forces acting around the peripheral edge of a transmissive optical element, or acting at various positions on the backside of a reflective element. Deformation of the lens element may be used to correct for aberrations or distortions in the image projected by the projection system PL. Contributions to image aberration may originate in any one of a number of optical components, for example, making up the projection system PL and may be caused by various factors. Thermal expansion linked to dissipative heating of elements in the beam path is a particularly common problem and one that is difficult to avoid completely.

Figure 2:
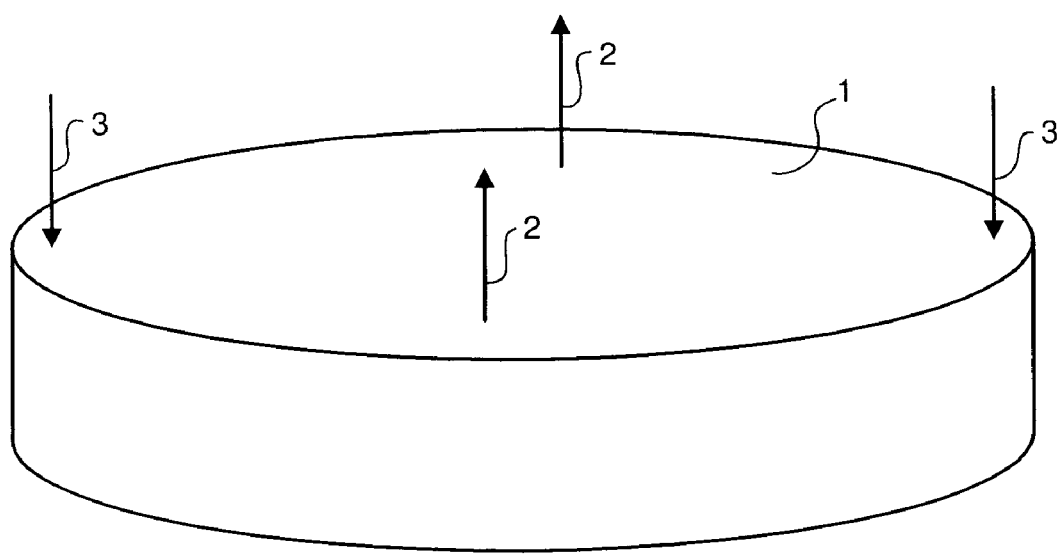
FIG. 2 depicts a lens element subjected to a distribution of forces suitable for compensating Zernike 5-type astigmatism.

FIG. 2 shows an example arrangement designed to overcome astigmatism (Zernike 5 in a rotationally symmetric system—see FIGS. 3 and 4 and the discussion below), an image distortion mode frequently associated with lens heating due to the fact that the radiation field passing through some of the optical elements in the projection system PL is often chosen to have a rectangular cross-section. A pair of vertical forces 2 act in conjunction with a pair of oppositely orientated vertical forces 3 in this arrangement to deform the corrective lens element 1 into a saddle shape, which shape is effective in correcting for astigmatism.

Figure 4:
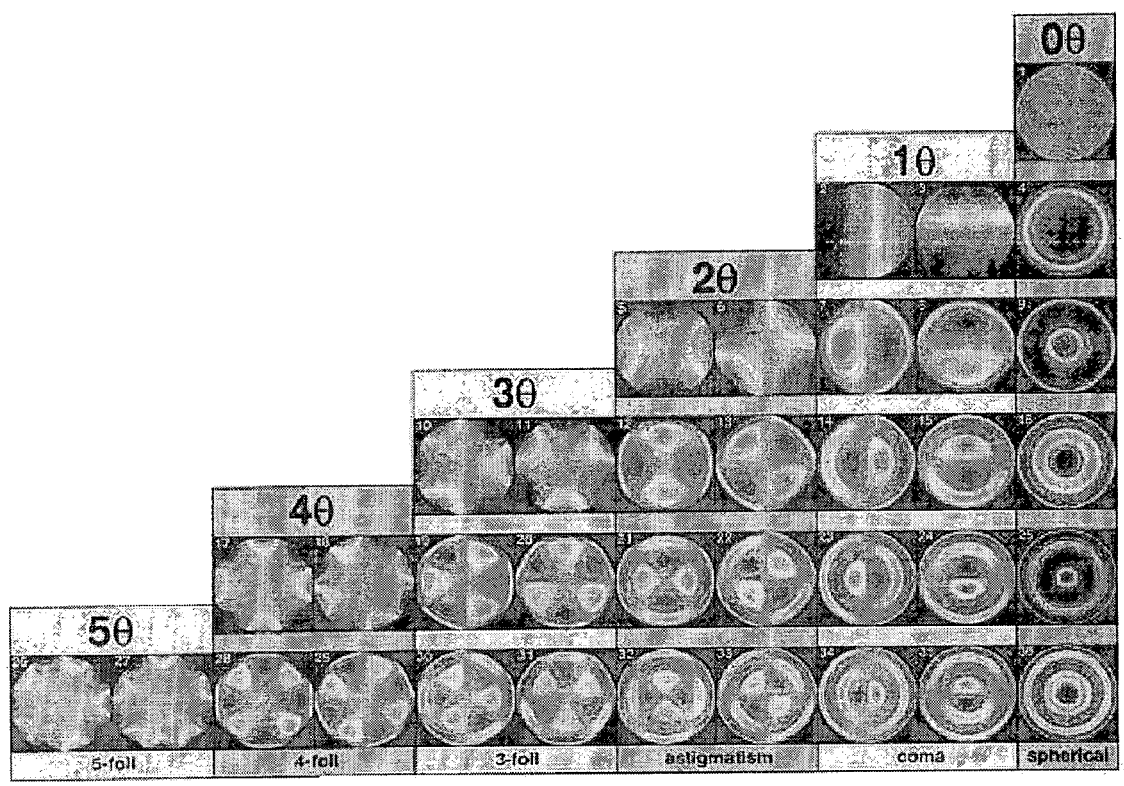
FIG. 4 is a table showing the shapes to which each of the Zernike polynomials defined in FIG. 3 correspond.

Lithographic optical systems frequently comprise optical elements that are rotationally symmetric about the optical axis of the system to which they belong. Image distortions arising in such systems and the lens distortions that would be required to correct for them can conveniently be expressed in terms of Zernike polynomials. FIG. 3, referred to above, provides the definition of Zernike polynomials that is used in the present application. The polynomials may be referred to either by their number (first column, FIG. 3), or by reference to their radial order (n) and their azimuth order (l) (final two columns, FIG. 3). FIG. 4 shows graphical representations of each of the shapes that the polynomials represent, the degree of distortion at a given position in each circular element, or "depth", being represented by the intensity of shading.

Although the examples that follow are described with reference to rotationally symmetric systems, an embodiment of the invention may be applied to optical systems with different symmetry. It is likely that the Zernike polynomials would not provide a convenient basis set in such systems and that image and lens distortions would be more conveniently expressed in terms of functions adapted to the symmetry of the system in question. Where Zernike polynomials are mentioned in the following description, it is understood that analogous functions would be used in an analogous way in systems of different symmetry. Furthermore, even in rotationally symmetric systems, basis sets different to Zernike polynomials may also be used in an analogous way without departing from the scope of the invention.

Returning to the example of a rotationally symmetric system using Zernike polynomials, the polynomials shown in FIG. 4 are grouped into vertical columns according to the type of aberration they represent. For example, the column headed "0θ" represents contributions to spherical aberrations, the column headed "1θ" represents contributions to coma, the column headed "2θ" represents contributions to astigmatism, the column headed "3θ" represents contributions to 3-foil aberration, the column headed "4θ" represents contributions to 4-foil aberration, and the column headed "5θ" represents contributions to 5-foil aberration.

As mentioned above, for rotationally symmetric systems, it is convenient to represent general distortion modes as expansions in Zernike polynomials. Normally, the largest contribution to any given type of distortion will come from one or more of the Zernike polynomials along the top diagonal, i.e. Z1, Z2/3, Z5/6, Z10/11, Z17/18 and Z26/27 (where Z# represents Zernike polynomial #, as defined in FIG. 3). For example, in the case of astigmatism, the largest contribution will likely come from Z5/6.

In order to correct for such distortions using a deformable lens element, a lens element deformation that causes a complementary image distortion as close as possible to the image distortion to be corrected should be provided so as to achieve the highest possible degree of cancellation. As a simple example, apparatus may be provided that is capable of applying the force distribution shown in FIG. 2, which is suitable for correcting for Z5 astigmatism to within an error of approximately 7%. More generally, out-of-plane forces may be used to produce distortions corresponding to any of the modes depicted in the top diagonal to within about 7% RMS error.

Unfortunately, real-life image distortions often contain contributions from higher order Zernike polynomials, such as those in the second diagonal—Z4, Z7/8, Z12/13, Z19/20, and Z28/29. These distortion modes cannot effectively be realized through the use of isolated out-of-plane forces on their own when these forces are limited to the outer radial edge of the lens element (as is usually unavoidable for transmissive lens elements).

According to one or more embodiments of the invention, apparatus is provided that allows access to some of one or more of these higher order distortion modes through the use of a combination of tangential moments with out-of-plane forces and/or radial bending moments. These one or more modes are achieved in particular for transmissive lens elements by applying localized torques at various positions (or "sub-regions") around the edge of a deformable lens element. In particular, arrangements are provided that allow substantial activation of (i.e. deformation of the lens element 1 into a shape with components substantially corresponding to) one or more modes corresponding to those depicted in the second diagonal of FIG. 4. These one or more modes may be achievable with an RMS error of less than 6-20% for a plane parallel or biconvex lens element. The result is that much finer correction of generalized distortions, which will tend to include contributions with higher order symmetries (i.e. those not in the first diagonal), may be possible. Moreover, the remaining error for creation of one or more Zernike shapes on the first diagonal may be reduced to less than 2%. The higher level correction could mean, for example, superior imaging quality for a projection system that comprises a deformable lens element and therefore of the lithographic apparatus itself. This improved performance may be seen in particular as greater contrast, leading, for example, to better critical dimension uniformity (i.e. reduced variation in the thickness of features to be printed).

According to one or more of the arrangements shown, a high level of compensation may be obtained by using a combination of all three kinds of force/bending moment. However, for practical reasons (e.g. ease of manufacture/minimized interference with other lithographic apparatus components), it may be desirable to select two out of the three options. Where this choice is made, good results may be obtained by selecting tangential bending moments in conjunction with either radial bending moments or out-of-plane forces. First diagonal Zernike components (Z5/6, Z10/11, Z17/18 and Z26/27) may be best obtained using a combination of tangential bending moments and out-of-plane forces (although these components may also be obtained to a high level using a combination of tangential and radial bending moments). The combination of tangential bending moments and out-of-plane forces may be advantageous over arrangements where all three force/bending moments are used because the extension members (as discussed below) may be made in a compact planar form. Second diagonal Zernike components (Z7/8, Z12/13, Z19/20, Z28/29), on the other hand, may be best obtained using a combination of tangential and radial bending moments (although these components may also be obtained to a high level using a combination of tangential bending moments and out-of-plane forces). The combination to use will depend on the expected form of distortion(s) that is likely to occur (and therefore needs compensating) during normal operation of the lithographic apparatus in question (in addition to the practical considerations mentioned above).

Figure 5:
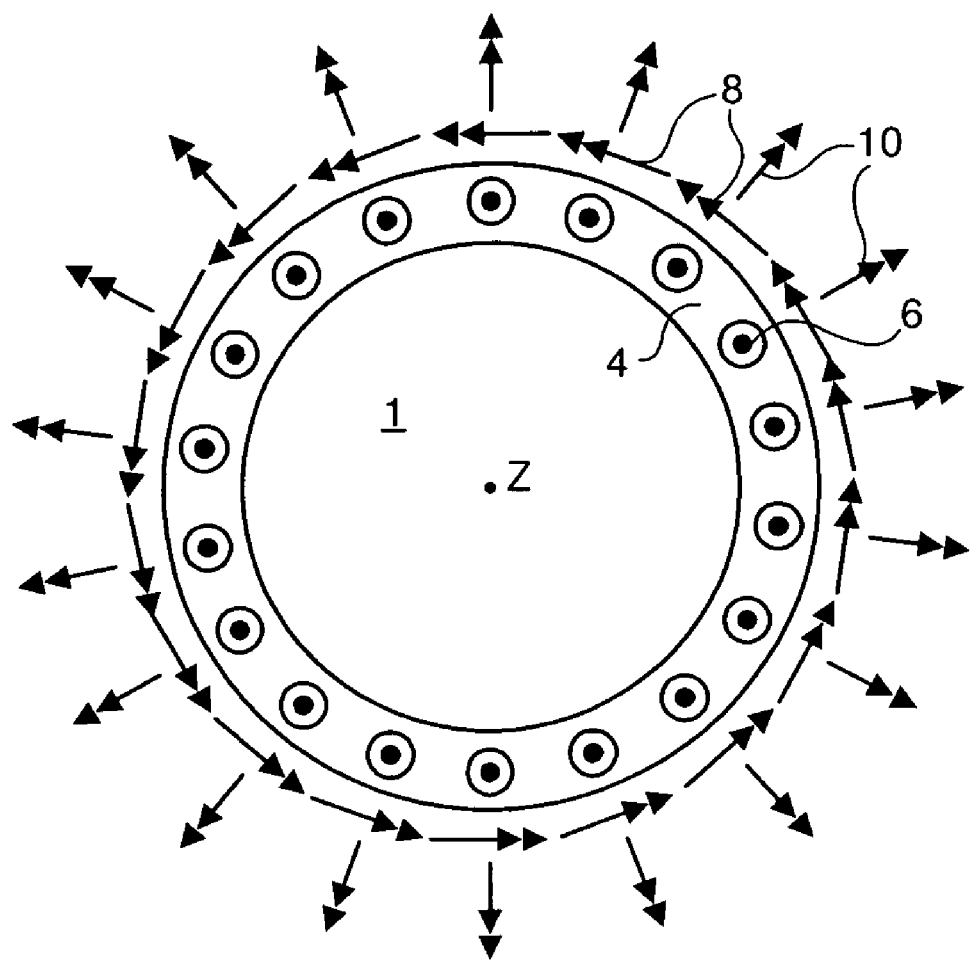
FIG. 5 depicts a distribution of forces and bending moments applied to a deformable lens element according to an embodiment of the invention.

FIG. 5 shows an on-axis view of a deformable lens element 1 according to an embodiment of the invention. The deformable lens element 1 is surrounded by a support frame 4 (in this case, of annular shape), which is connected to an outer radial extremity of the deformable lens element 1, defined relative to an axis Z, and acts to support the deformable lens element 1 and maintain its translational position. Apparatus is provided to apply vertical out-of-plane forces 6 (shown as concentric circles to indicate that these forces are acting "out of the page"), parallel to the axis Z, to the support frame 4, in a similar manner to those forces shown in FIG. 2 but at more closely spaced intervals. On their own, these forces may be used to produce distortion modes approximately corresponding to the first diagonal of Zernike polynomials as discussed above. In addition, apparatus is provided to apply tangential and radial bending moments, as shown by double-headed arrows 8 and 10 respectively and described in more detail below. In each case, the bending moment is such that the material is forced to bend around an axis parallel to the arrow representing the "direction" of the bending moment (the definition being analogous to the vector representation of torque: if the material was free to rotate, the forces responsible for the bending moment would cause the body to rotate about an axis parallel to the same arrow). For example, a tangential bending moment applied uniformly around the periphery of the support frame 4 as depicted in FIG. 5 would produce a dome-like distortion such as that depicted by Zernike polynomial 4. As a further example, a distribution of equally spaced radial moments of the same size but of alternating sense would lead to an undulating pattern around the edge of the support frame 4.

Figure 6A:
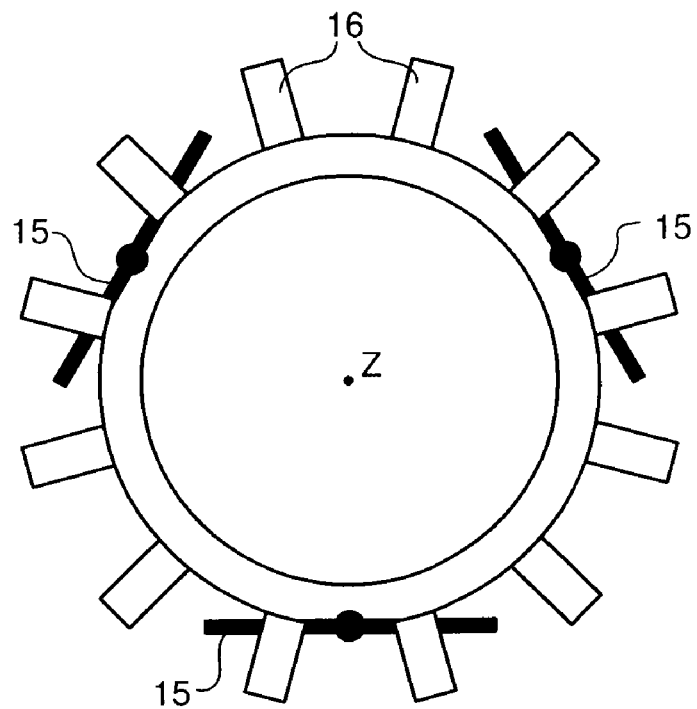
FIG. 6A depicts a statically supported deformable lens element with extension members.
Figure 6B:
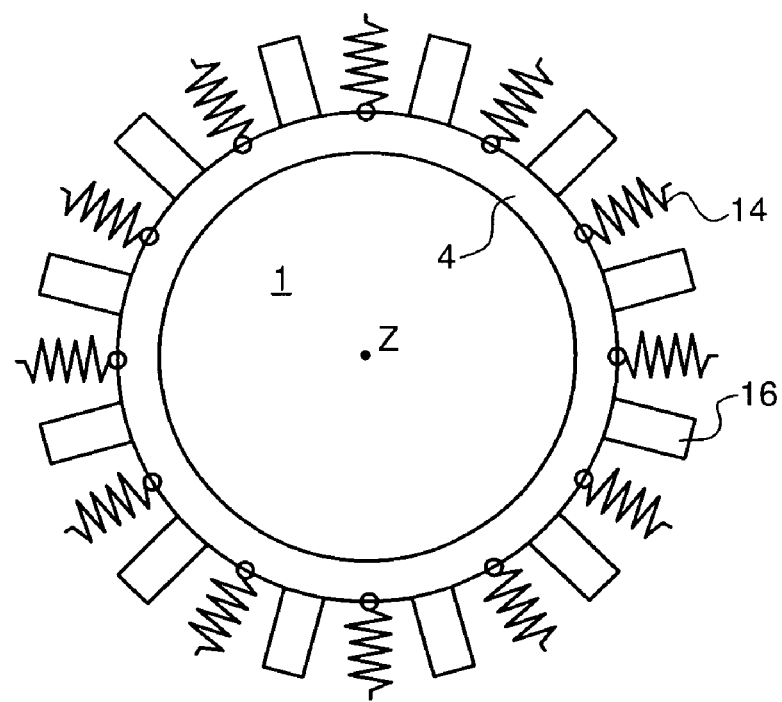
FIG. 6B depicts the deformable lens element of FIG. 6a supported by a system of weak mechanical springs.

FIGS. 6A and 6B show alternative ways in which the deformable lens element 1 may be mechanically supported. FIG. 6A depicts an arrangement in which the lens element 1 is constrained in exactly 6 degrees of freedom. This may be achieved, for example, through the use of 3 tangential and axial leaf springs 15 connected to the support frame 4 at outer radial portions separated by 120° (leaf springs of this type are designed to give rigid support along the tangential and axial directions while providing relatively weak support in the radial direction). This arrangement has a disadvantage of requiring additional Z (translation along axis Z), RX (rotation about axis X) and RY (rotation about axis Y) rigid body motions of this or other lens elements when Zernike shapes are needed that have out-of-plane displacement at the fixation points. Z, RX and RY rigid body motions are not realized with this configuration on its own.

FIG. 6B shows an alternative arrangement wherein a larger number of weak mechanical springs 14 are used to support the deformable lens element 1. Right-angle leaf-springs may be used for this purpose. These springs are weak in the radial direction but stronger in the tangential and axial directions. The strengths in these latter two directions may be chosen to be low enough so as not to increase the required actuator forces, but stiff enough to achieve a high resonant frequency. If the resonant frequency of the system is too low, it risks being activated to an undesirable extent during normal use, thus potentially compromising the stability of the system. On the other hand, if the interface stiffness is too high, then the actuator may have to provide larger forces to actuate the lens element 1. In the arrangement shown in FIG. 6A, the actuator forces are only determined by the stiffness of the deformable lens element 1 itself, and not by the interface stiffness.

As shown in FIGS. 6A and 6B, extension members 16 are provided at regularly spaced intervals around the periphery of the support frame 4. Each extension member 16 is rigidly connected to the support frame 4 and provides a means by which out-of-plane forces, radial bending moments and tangential bending moments may be applied simultaneously to the deformable lens element 1. As shown, the forces/bending moments are applied to the lens element 1 via extension members 16 that are connected to the support frame 4, but this need not be the case and the forces/bending moments may be applied to extension members 16 connected directly to the lens element or to extension members 16 forming part of the lens element (outside of a central optically active portion). Alternatively, forces and/or bending moments may be applied directly to the deformable lens element 1 or a combination of the above may be realized.

Figure 7A:
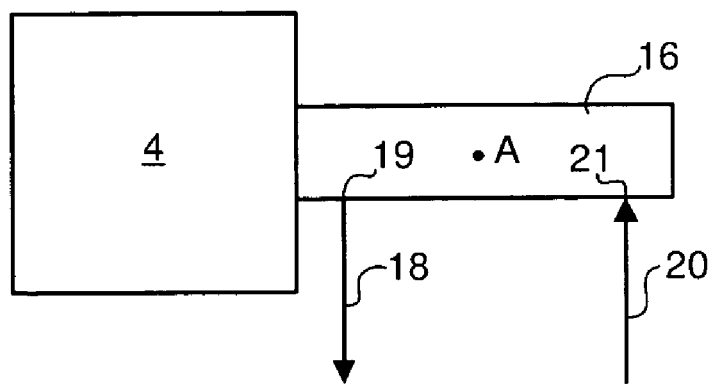
FIG. 7A depicts a two-force arrangement applied to a planar extension member, capable of producing a tangential bending moment and/or an overall vertical force (up or down depending on the relative magnitudes of the two forces shown)
Figure 7B:
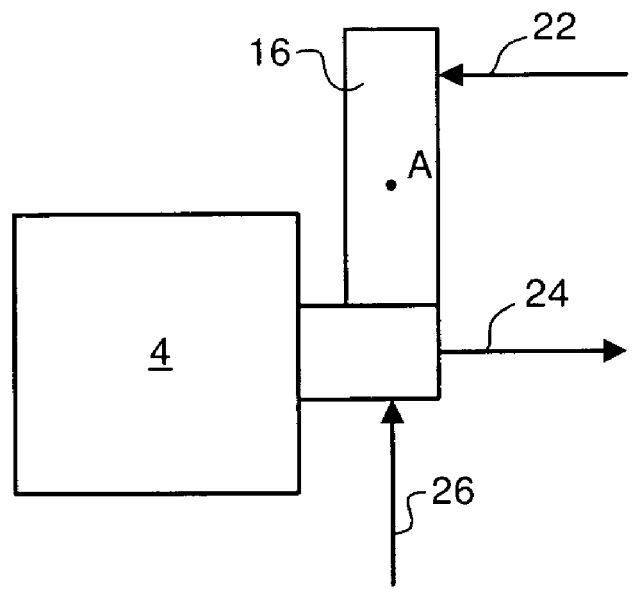
FIG. 7B depicts a three-force arrangement applied to an extension member with a vertically-oriented component (parallel to the deformable lens axis), for producing a tangential bending moment in combination with a vertical force.
Figure 7C:
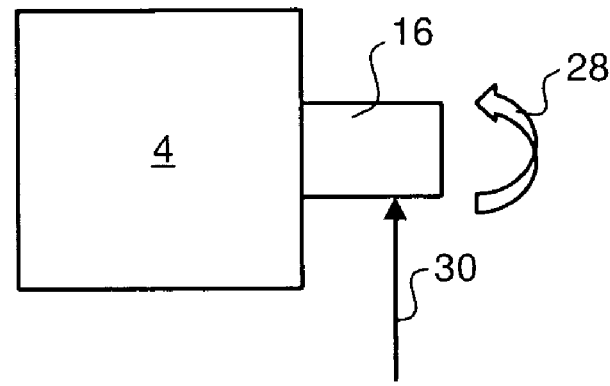
FIG. 7C depicts a one-force, one-torque arrangement applied to a planar extension member for producing a tangential bending moment in combination with a vertical force.

FIGS. 7A, 7B and 7C show three ways in which a tangential moment and an out-of-plane force can be applied to an extension member 16.

In FIG. 7A, two out-of-plane forces 18 and 20 are applied to the extension member 16 at a radially inner position 19 and a radially outer position 21. If the forces 18 and 20 are of equal magnitude but opposite in direction, they will tend to produce a rotational torque or bending moment about the axis A (directed out of the page for the configuration shown) and thus a tangential moment on the support frame 4. A combination of a tangential moment and an out-of-plane vertical force may be achieved by making force 20 different in magnitude to force 18. This arrangement has an advantage of only requiring two forces to be applied at two distinct points. In addition, it may be realized in a highly planar form, which may be advantageous from a design perspective. This form may also be more easily manufactured, particularly where any two or more of: the deformable lens element 1, the support frame 4 and the extension members 16 are fabricated from a single piece of material.

FIG. 7B shows an alternative arrangement, wherein the extension member 16 comprises a portion oriented in a direction substantially parallel to the optical axis of the lens element 1. In this case, a bending moment about axis A may be provided by forces 22 and 24 (applied substantially parallel to the plane of the lens element) to create the tangential moment on the support frame 4, with an out-of-plane vertical force provided by force 26. This arrangement limits the extent to which the extension members protrude radially, which may be beneficial where space is limited in this direction.

Finally, FIG. 7C shows an arrangement where a bending moment 28 and an out-of-plane force 30 are applied directly to the extension member 16.

Of the embodiments shown in FIGS. 7A, 7B and 7C, the embodiment of FIG. 7A has an advantage over the arrangement shown in FIG. 7B in that only two forces (and likely two actuators) are needed. In comparison with the arrangement in FIG. 7C, where only a force and a torque actuator are needed, the arrangement in FIG. 7A allows a broader range of forces to be applied to the extension member 16. Further, it may be easier to implement two force actuators in comparison with a force actuator in combination with a torque actuator because cross-talk between such actuators may be avoided.

Figure 8A:
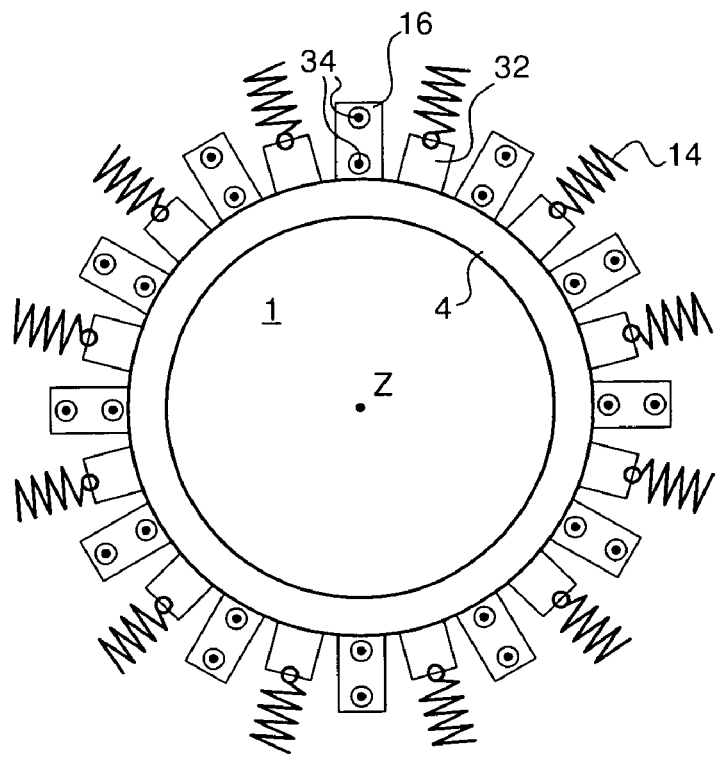
FIGS. 8A and 8B depicts a distribution of forces applied to extension members, and to extension members and mechanical spring anchor members, at radially inner and radially outer portions, to produce tangential bending moments.
Figure 8B:
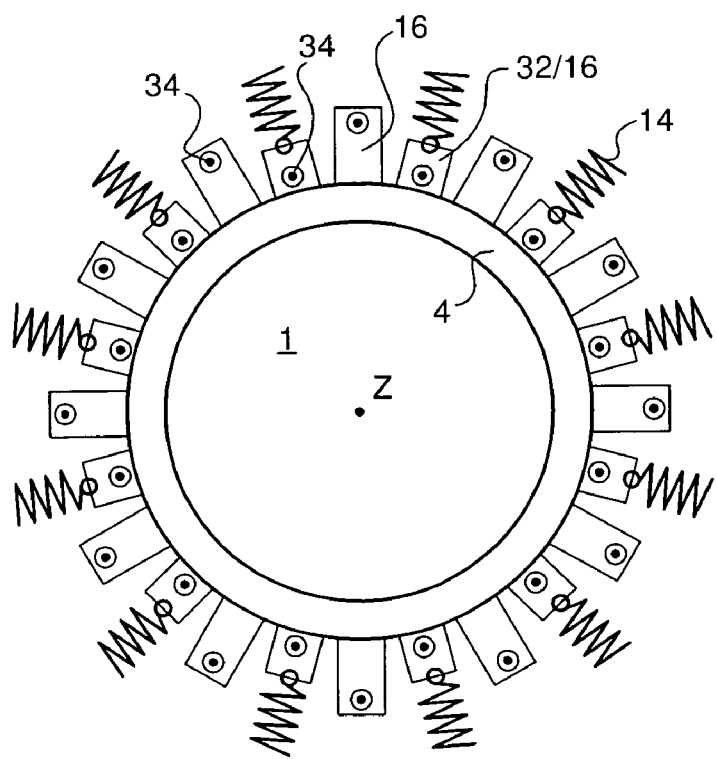

FIGS. 8A and 8B show embodiments based on an extension member 16 and force distribution according to the concept depicted in FIG. 7A in combination with the support method according to the embodiment depicted in FIG. 6B. FIG. 8A shows an arrangement wherein extension members 16, to which actuation forces 34 are applied, are kept separate from spring anchor members 32 via which the support springs 14 make mechanical contact with the support frame 4. This arrangement is relatively simple to implement and benefits from the fact that one or more force actuator may be brought into place in the spaces between the support springs 14 with a minimum risk of interference. FIG. 8B, on the other hand, distributes actuation forces between extension members 16 and spring anchor members 32. This arrangement may provide a more even distribution of forces around the periphery of the support frame 4. Bending moments are achieved by applying forces at an inner radial position on the spring anchor members 32 and at an outer radial position on the extension members 16. In both cases of FIGS. 8A and 8B, a localized torque is applied by one or more actuators via the extension members 16 (in cooperation with the mechanism supporting the deformable lens element) to produce the desired bending moment. Localized torque is here intended to mean a torque applied locally to a region that is substantially smaller than the overall size of the deformable lens element 1. That is, the forces constituting the torque are applied at closely spaced positions relative to the diameter or other characteristic dimension of the cross-section of the deformable lens element 1.

The types of bending moment produced by the force distribution illustrated in FIGS. 8A and 8B may be quite different. Which of the two arrangements to adopt will probably depend not only on mechanical considerations but also on which distortion modes it will be used to correct for.

In some of the embodiments discussed above, forces and bending moments are arranged to be applied to the lens element 1 via the intermediary of a support frame 4. This arrangement avoids forces and bending moments being applied too locally to the lens element and is advantageous where a limited number of extension members are supplied as it can be configured to distribute the deforming effect transmitted to the lens element. However, as mentioned above, the support frame 4 may be excluded without departing from the scope of the invention. In particular, it may be desirable not to include a support frame 4 where a large number of extension members 16 have been provided.

Figure 9:
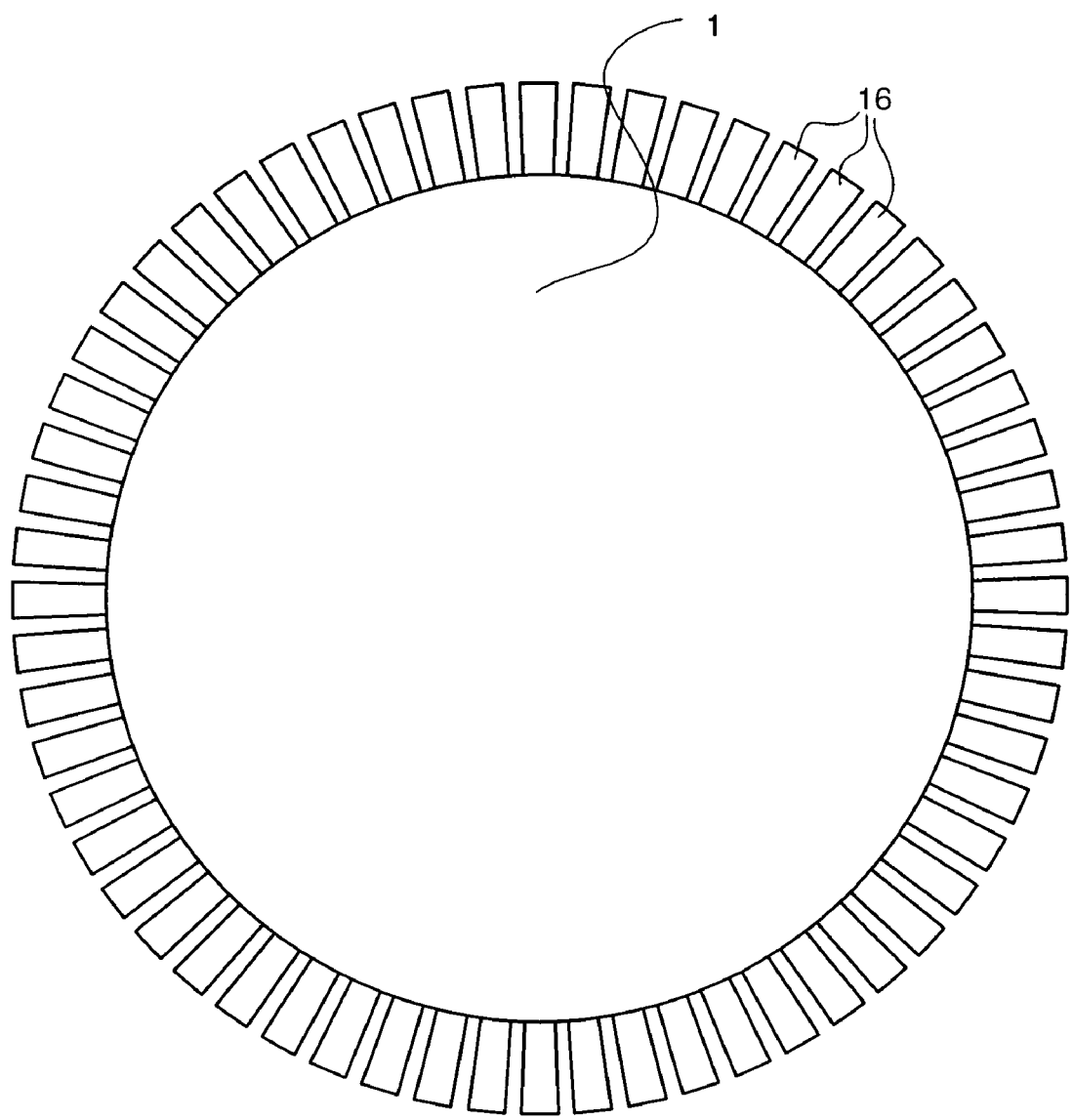
FIG. 9 depicts a deformable lens element with closely spaced fingers as extension members.

FIGS. 9 and 10 show possible arrangements wherein the deformable lens element 1 and the extension members 16 are created from a single piece of material. The extension members 16 according to this arrangement may be provided at closely spaced intervals in the form of fingers. This arrangement has the advantage of requiring fewer components than embodiments based on the use of a support frame connected to a separate deformable lens element 1. Material interfaces are avoided which may be advantageous from the point of view of structural stability and longevity. FIG. 10 shows a number of possible geometries for extension members 16 for different shapes of lens element 1.

In each of the embodiments disclosed above, a mechanical actuator is envisaged for applying forces to the extension members. This could be achieved by pressing an element (or elements) into contact with each of the extension members 16 in a controlled manner (see discussion below).

According to an embodiment of the invention, forces and bending moments may be applied to the deformable lens element 1 without the need for mechanical contact being made between extension members and one or more actuators. In this embodiment, referring to FIG. 11, one or more magnetic force and torque actuators 42 may be provided, each of which can be individually controlled in order to apply a torque and/or an out-of-plane force. The support frame 4 is provided with a series of magnetic dipoles arranged tangentially around the periphery of the support frame 4 so as to create alternating regions of north and south magnetic poles (depicted by "N" and "S" respectively). Each of the one or more magnetic actuators 42 comprises a pair of electromagnets 54 and 56. These are arranged so that the support frame 4 is positioned to lie at least partially within the jaws 48 and 50 of electromagnets 54 and 56 respectively. The electromagnets 54 and 56 are arranged to provide a magnetic field substantially parallel to the axis Z of the deformable lens element 1, which passes through the support frame 4. The size and direction of the magnetic field supplied by the electromagnets 54 and 56 is controlled in turn by an electromagnetic current controller 40. The electromagnet current controller 40 supplies a current I1 to electromagnet 54 and a current I2 to electromagnet 56. The electromagnet jaws 48 and 50 are radially separated in such a way that both a torque (bending moment) and an out-of-plane force may be applied to a portion of the support frame 4. In the embodiment depicted in FIG. 11, the magnetic fields supplied by electromagnets 54 and 56 are arranged to be opposite to each other (as is depicted schematically by the opposite arrangement of north and south poles). If the magnitude of the magnetic fields supplied by electromagnets 54 and 56 are the same, then only a bending moment or torque is applied to the support frame 4.

Figure 12:
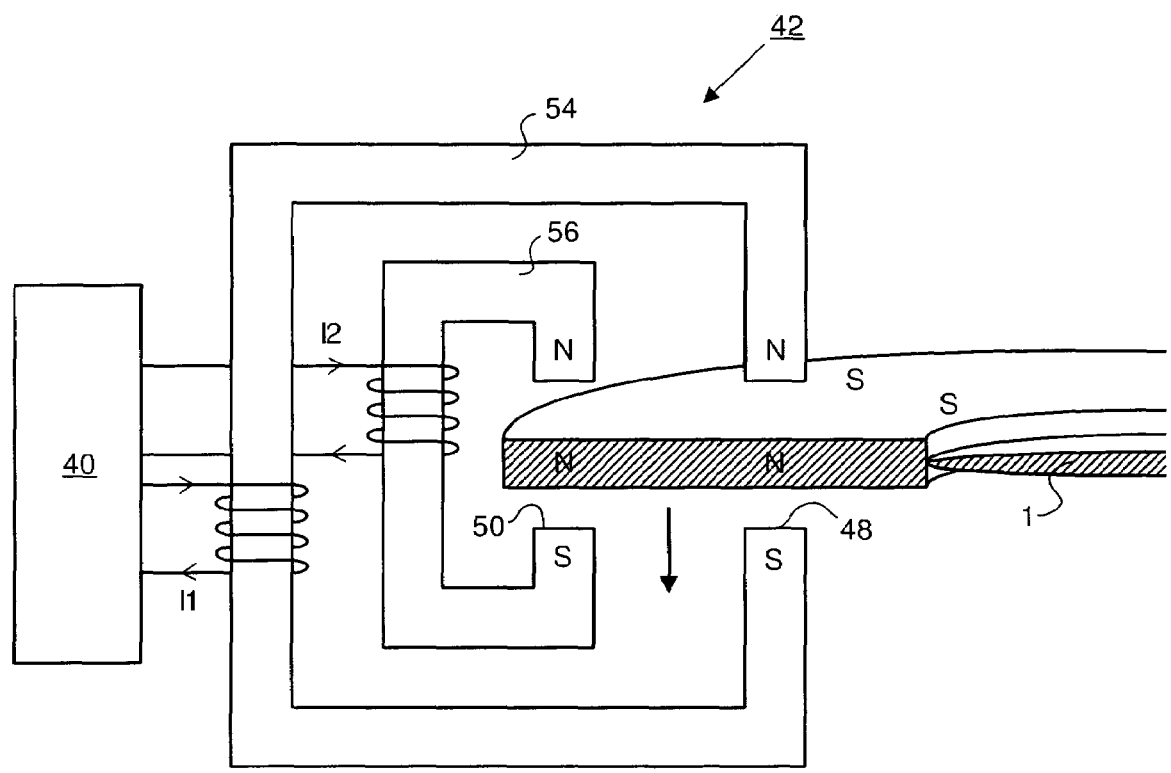
FIG. 12 depicts a pair of electromagnets arranged to apply a vertical force to a portion of the support frame parallel to an axis of the deformable lens element.

FIG. 12 shows the situation wherein the fields supplied by electromagnets 54 and 56 are in the same sense. If the magnitude of the magnetic field supplied by electromagnets 54 and 56 are also the same, then only an out-of-plane force will be applied to the support frame 4 in this configuration.

Figure 11:
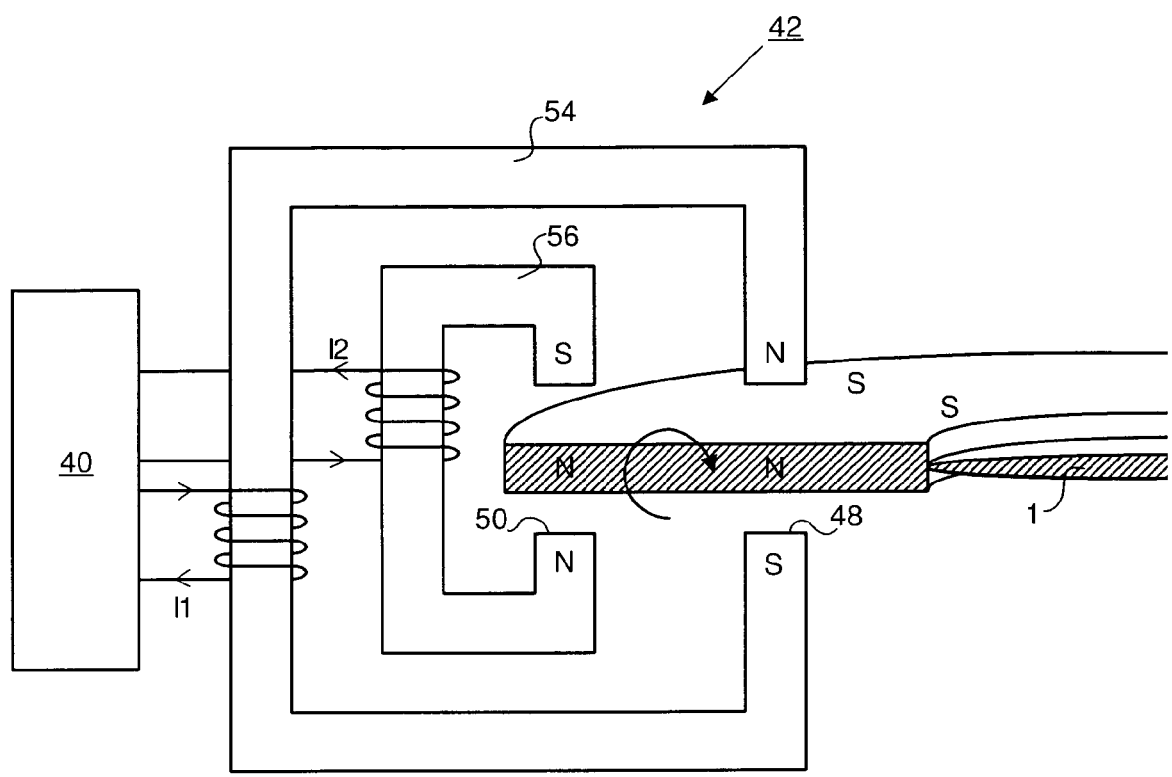
FIG. 11 depicts a pair of electromagnets arranged to apply a tangential bending moment to a support frame.

An advantage of the embodiment depicted in FIGS. 11 and 12 is that a single compact apparatus may be used to apply both an out-of-plane force and a torque or bending moment to a portion of the support frame 4. FIGS. 11 and 12 illustrate extreme cases where either a torque or an out-of-plane force is applied, but a combination of the two can be achieved in the same apparatus by arranging for the electromagnets to apply forces differing in magnitude. Radial bending moments may be applied by arranging for one or more adjacent magnetic actuators 42 to apply out-of-plane forces in opposite senses.

In addition to being compact, the magnetic actuator arrangement described may provide quick response times. Further, the magnetic actuator arrangement may operate without physical contact between the actuator element and the support frame 4, which may improve the reliability of the arrangement as well as providing for predictable performance. For each of the electromagnets 54 and 56, the size of the magnetic field generated depends on the current supplied by the electromagnet current supply controller and the number of turns of wire wound onto the respective electromagnet cores.

Figure 13A:
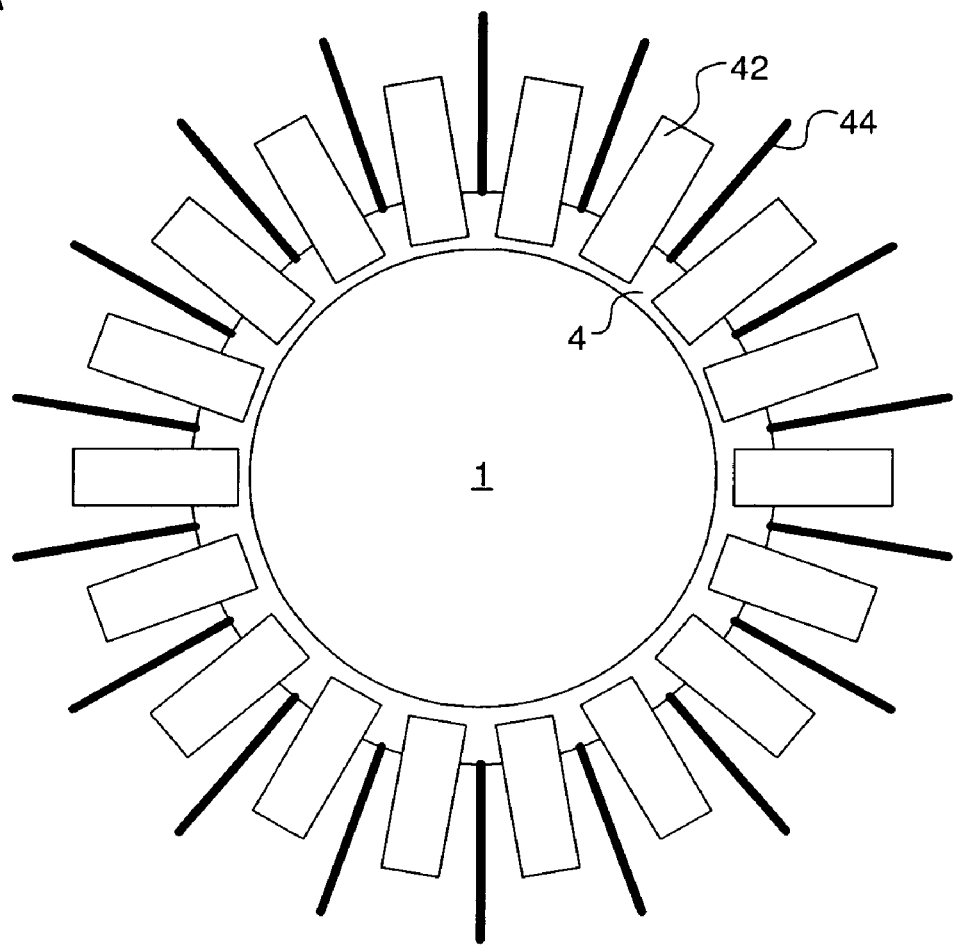
FIGS. 13A and 13B depict an arrangement of magnetic actuators around a peripheral edge of the deformable lens element, magnetic dipoles connected to a support frame and support rods supporting the deformable lens element.
Figure 13B:
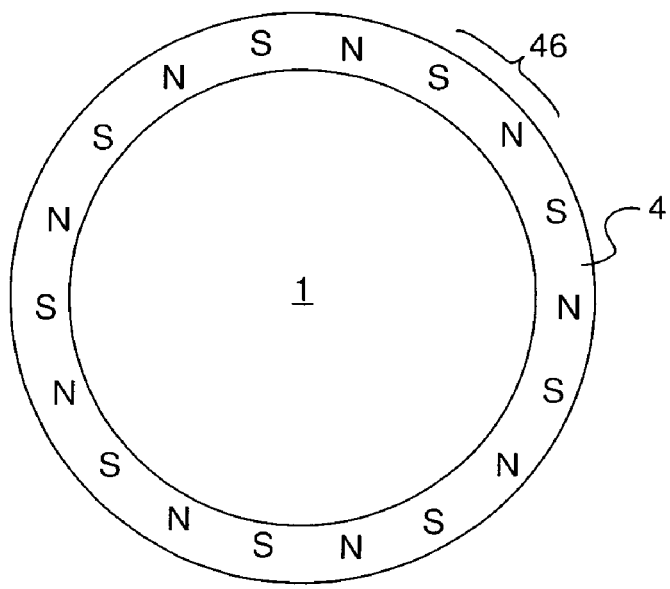

FIGS. 13A and 13B show how a plurality of magnetic actuators and magnets may be mounted relative to each other. For clarity, the support frame 4 comprising the alternating zones of north and south poles is shown separately in FIG. 13B from the arrangement with the magnetic actuators and support rods 44 in place, shown in FIG. 13A. According to this arrangement, magnetic actuators 42 are arranged at regularly spaced positions around the periphery of the support frame 4. The separation is chosen so that alternate actuators 42 are aligned over north pole regions of the support frame 4, whereas the remaining actuators are positioned over south pole regions of the support frame 4. The operation of an actuator 42 does not depend on whether it is positioned over a north pole region or a south pole region as the same force and torque combination can be achieved simply by reversing the currents I1 and I2. Support rods 44 are arranged to be interleaved with the magnetic actuators 42 according to the arrangement shown in FIG. 13A. The support rods 44 may comprise weak mechanical springs as discussed above in relation to the embodiments depicted in FIGS. 6B, 8A, 8B, etc. The support rods 44 should provide sufficient compliance to allow the deformable optical element 1 to be efficiently manipulated but care should be taken as discussed above to avoid excessively low resonant frequencies of the lens element and support rod system.

Other actuator system types may be used in an analogous configuration to that discussed above. For example, one or more actuators based on the piezoelectric effect may provide high and well-defined forces per unit volume of actuator without the energy dissipation that may be associated with magnetic actuators. However, these actuators can be expensive and likely use physical contact in order to transmit forces and/or torques to the deformable lens element (although this contact may be made via a mechanical spring or other suitable coupling device—see below). They may also suffer from mechanical creep after positioning of the piezoelectric device. Alternatively, one or more actuators based on pneumatically applied force may be used. Here, the actuator head may be made quite compact but voluminous tubing and controlling valves have to be provided as well as potentially expensive pressure sensors.

FIGS. 14A to 14D illustrate example embodiments, shown in radial cross-section, of combined force actuators (i.e. actuators capable of applying both localized torques and out-of-plane forces) using a non-electromagnetic actuator.

Figure 14A:
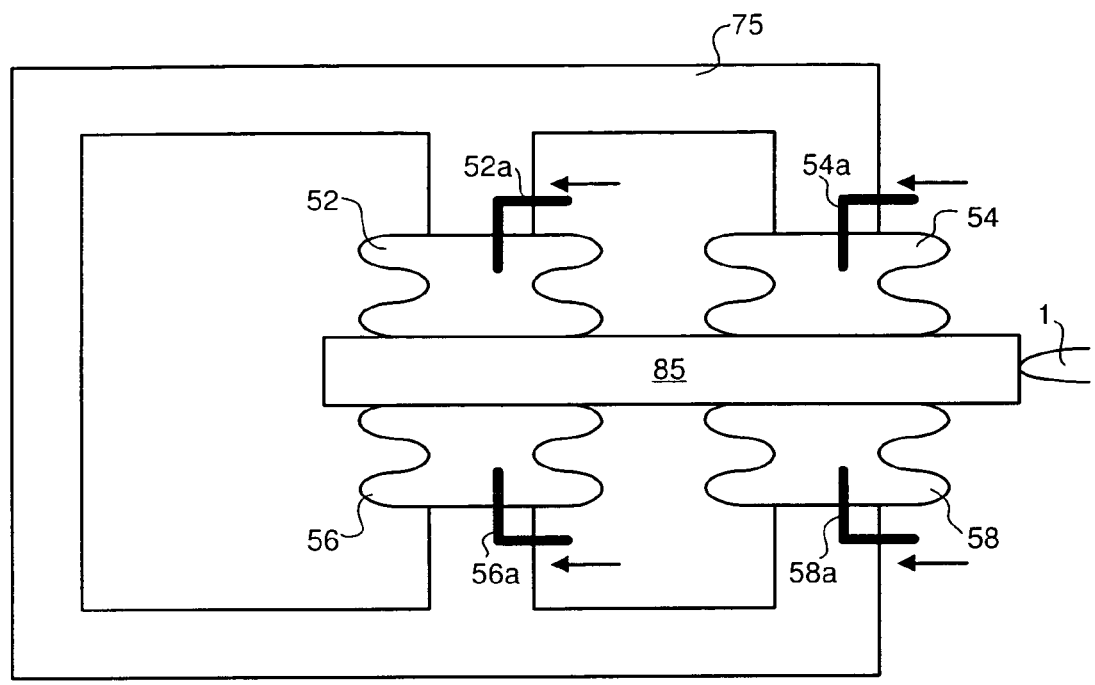
FIGS. 14A to 14D depict alternative embodiments of a combined force/torque actuator.

FIG. 14A shows an arrangement using pneumatically applied forces using pneumatic actuators. Bellows 52, 54, 56 and 58 are arranged to apply vertical (i.e., substantially parallel to the optical axis) forces at radially inner (bellows 54 and 58) and radially outer (bellows 52 and 56) positions on a subregion of a support frame 85 configured to transmit the resulting forces/torques to the deformable lens element 1 connected thereto. An actuator core 75 mechanically supports the bellows themselves. As mentioned above, the support frame 85 may be omitted and the bellows 52, 54, 56 and 58 may be arranged to act directly on a peripheral portion of the lens element 1 itself. Each of the bellows is connected via pipes 52a, 54a, 56a and 58a to a device which can control the force applied by each bellows by adjusting the pressure inside. In the configuration shown in FIG. 14A, for example, a uniform upwards force may be obtained by setting the pressures in bellows 52 and 54 to P1, the pressures in bellows 56 and 58 to P2, and arranging for P1<P2. Similarly, a pure downwards force may be obtained by setting P1>P2. A pure torque may be obtained by setting the pressures in bellows 52 and 58 to P3, the pressures in bellows 54 and 56 to P4, and arranging for P3 to be different to P4. A mixture of torque and net force can be obtained by applying a mixture of the two regimes discussed above, which results in a mixture of at least three different bellows pressures.

Figure 14B:
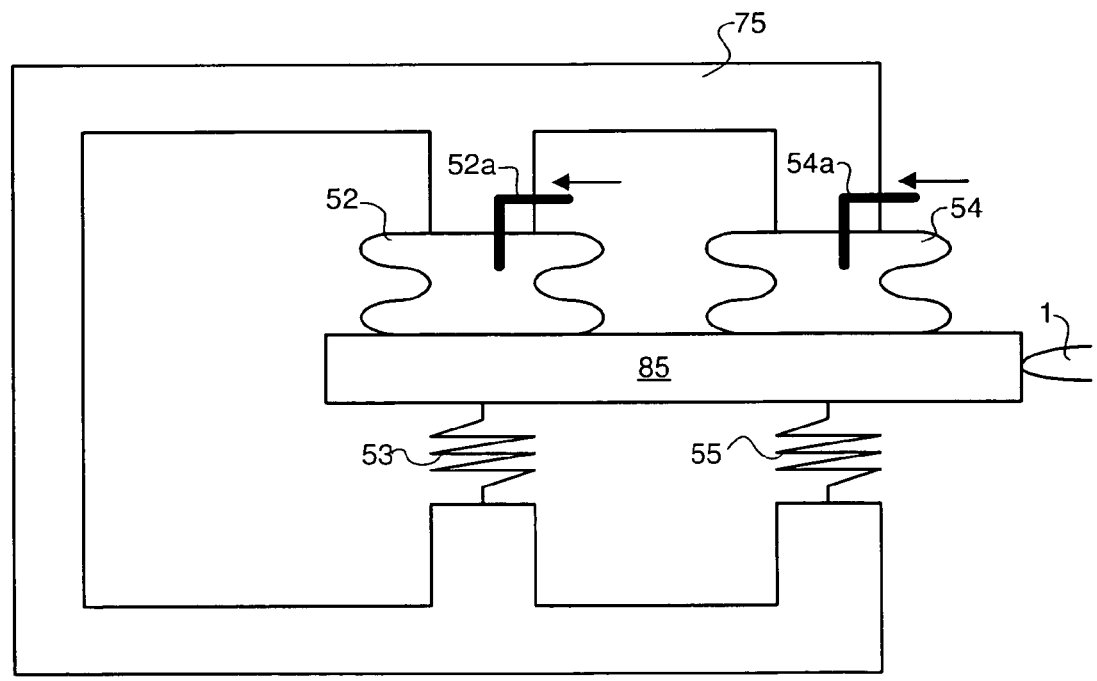

FIG. 14B shows a variation on the arrangement depicted in FIG. 14A where the lower pneumatic bellows 56 and 58 are replaced by passive springs 53 and 55. This arrangement allows the same variety of forces to be applied but can be implemented with half the number of bellows, which may be useful for space-saving, economy, reliability, etc. On the downside, this arrangement may need a constant force from bellows 52 and 54 even when no lens element deformation is required in order to offset the repulsive force of the springs.

Figure 14C:
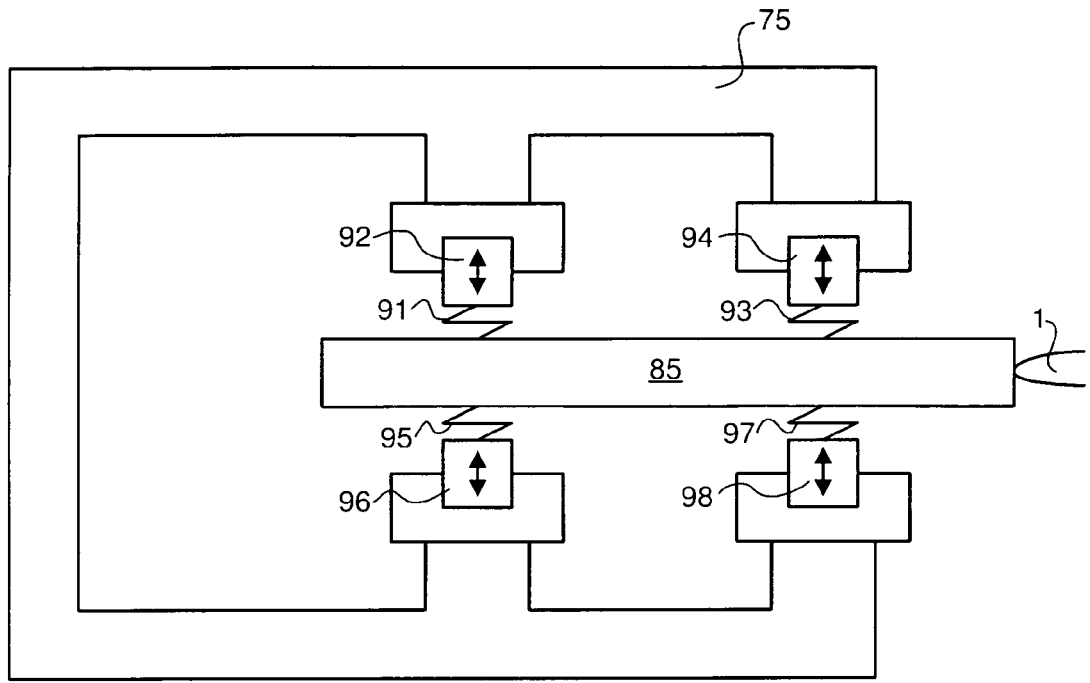

FIG. 14C shows an arrangement analogous to that depicted in FIG. 14B but uses piezoelectric actuators 92, 94, 96 and 98 rather than pneumatic actuators to apply the forces to the support frame 85 (or lens element 1). Springs 91, 93, 95 and 97 may be incorporated between the piezoelectric actuators and the support frame 85 (or lens element 1) in order to allow for mounting tolerances and adapt the force/stroke of the actuated element (the support frame 85, etc.) with the force/stroke of the piezoelectric actuators.

Figure 14D:
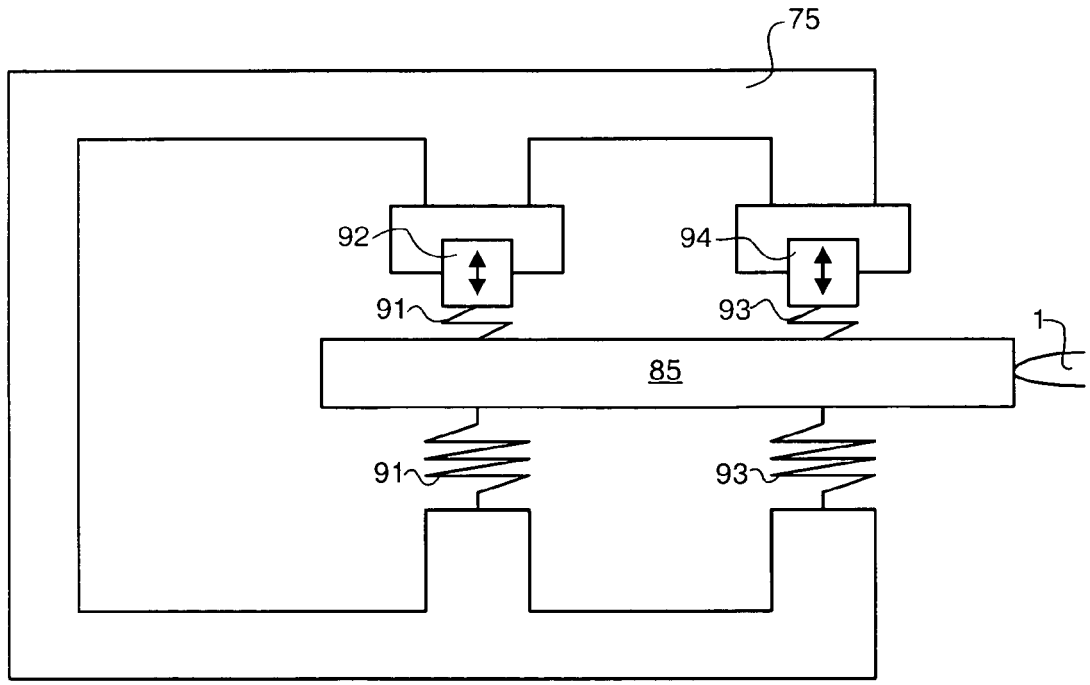

FIG. 14D shows an arrangement analogous to that depicted in FIG. 14B described above but with piezoelectric actuators instead of pneumatic actuators.

Other forms of actuator that are capable of applying a controlled vertical force may be used in the same configuration as the pneumatic and piezoelectric actuators described above without departing from the scope of the invention.

Figure 15:
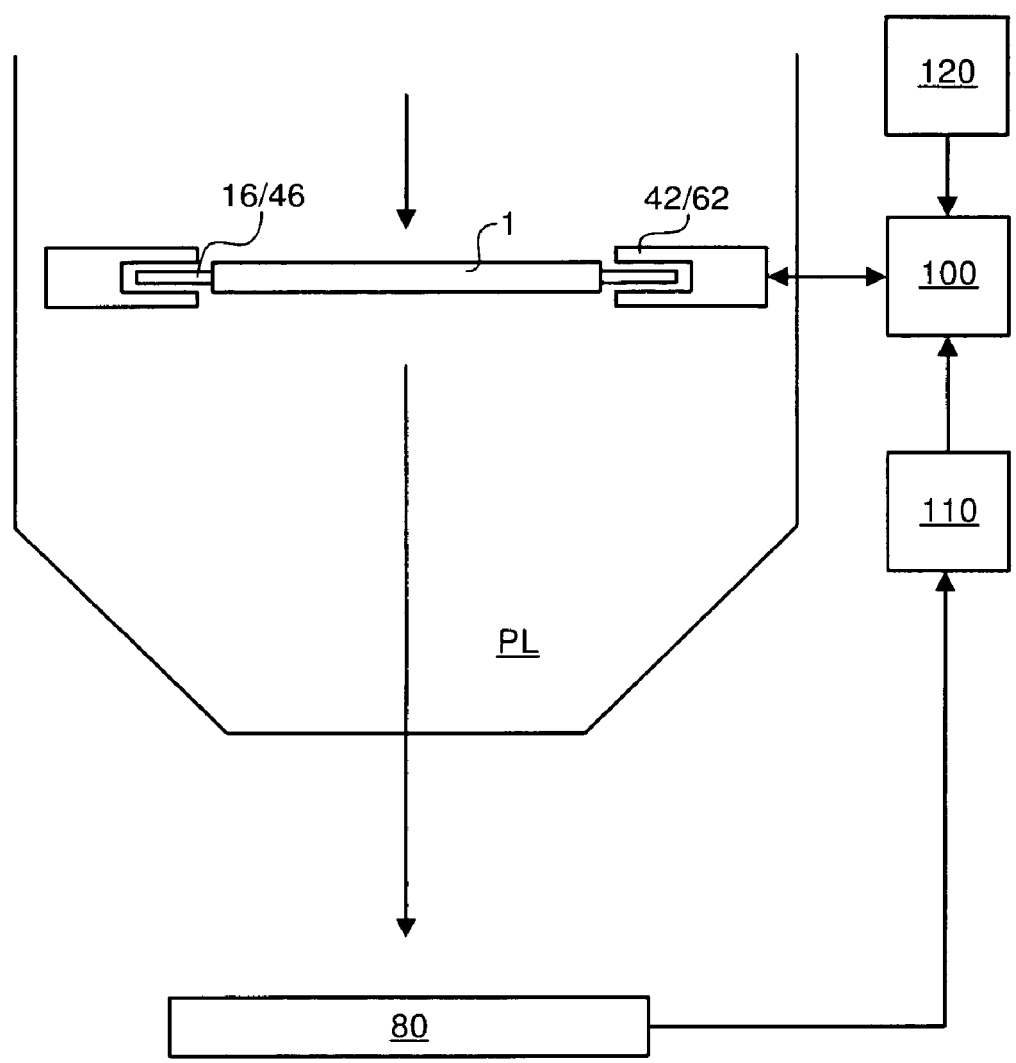
FIG. 15 depicts a controller configured to control the operation of extension member actuators in order to correct for a lens distortion detected by a image distortion sensor.

FIG. 15 shows a schematic arrangement of an apparatus designed to correct for image aberrations by providing a complementary (cancelling) distortion according to an embodiment of the invention. The deformable lens element 1 is shown as forming part of a projection lens PL of a lithographic apparatus. Actuators 42/62 are arranged to interact with magnetic dipoles 46 and/or extension members 16, respectively, associated with a support frame or, as shown, directly with a portion of the lens element. A controller 100 controls the forces and/or tangential/radial bending moments. The controller 100 calculates a distribution of forces and bending moments to apply on the basis of an image distortion measured by a image distortion sensor 80, such as an ILIAS sensor. The image distortion sensor 80 may transmit image distortion data to an image distortion analyzer 110. The image distortion analyzer may be configured to analyze the way test patterns are imaged through the deformable lens element 1 (this forming part of the image distortion data) and may compare the image reaching the image distortion sensor 80 with a standard stored image corresponding to that which would be projected by an aberration-free projection system. The analyzed distortion may be expressed as an expansion in Zernike polynomials and passed to the controller 100 for compensation.

It is unlikely that the controller 100 will be able to produce, via the actuators 42/62, a set of distortion modes that exactly correspond to Zernike polynomials. However, the arrangement of actuators described above allow distortion modes to be created that are close to at least those represented by the first two diagonals of the Zernike polynomials table in FIG. 3. Each mode actually available to the controller 100 may be arranged predominantly to consist of one of the Zernike polynomials together with a small admixture of one or more other components. The controller 100 may be provided with a computing device configured to carry out a matrix transformation to convert between the Zernike polynomial coordinate system in which the distortion measured by the sensor 80 may be expressed (via the image distortion analyzer 110), and the coordinate system available to the controller 100. Details of the matrix transformation to use may be obtained from calibration measurements involving the analysis of standard patterns imaged by the deformable lens element while it has been distorted into each one of the approximate Zernike polynomial distortion modes. An alternative method to calibrate the distortions of the deformable lens element 1 caused by the actuators may be simply to analyze the distortion caused by each of a plurality of actuation states of the actuators (either individually, or in groups). The measured distortions may in each case be expressed as an expansion in Zernike polynomials, or in some other convenient form. Whichever calibration method is used, the controller 100 may access the relevant calibration data from a table stored in a calibration table storage 120.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a projection system configured to project a patterned radiation beam onto a target portion of a substrate;
a deformable lens element through which the patterned radiation beam is arranged to pass before reaching the substrate; and
a deformable lens actuator configured to control the shape of the deformable lens element, the deformable lens actuator configured to transmit a combination of a net force substantially parallel to the optical axis of the projection system and a localized torque about an axis substantially perpendicular to the optical axis independently at each of a plurality of sub-regions on the deformable lens element.

2. The apparatus according to claim 1, wherein the plurality of sub-regions are located adjacent to an outer periphery of the deformable lens element.

3. The apparatus according to claim 1, wherein the deformable lens actuator is configured to apply forces to a subset of the sub-regions at radially inner portions thereof and simultaneously to apply forces to a subset of the sub-regions at radially outer portions thereof.

4. The apparatus according to claim 3, wherein the deformable lens actuator comprises mechanical springs, pneumatic bellows, piezoelectric actuators, electromagnetic actuators, or any combination thereof, configured to apply the forces to the radially inner and outer portions of the sub-regions.

5. The apparatus according to claim 1, further comprising a plurality of extension members, each connected to the deformable lens element around an outer extremity and arranged so that the combination of force and localized torque to be transmitted to the deformable lens element is generated by application of forces to the extension members.

6. The apparatus according to claim 5, wherein the plurality of extension members are connected to the deformable lens element via a support frame configured to support the deformable lens element around an outer extremity thereof.

7. The apparatus according to claim 5, wherein an extension member comprises a portion protruding beyond an extremity of the deformable lens element.

8. The apparatus according to claim 5, wherein an extension member comprises a portion protruding beyond the deformable lens element in a direction substantially parallel to the optical axis of the projection system.

9. The apparatus according to claim 1, further comprising an actuator controller configured to set magnitudes of a set of forces in order to control the shape of the deformable lens element and wherein the deformable lens actuator is arranged to apply the set of forces to the plurality of sub-regions, including forces applied at a plurality of locations on each of a subset of the plurality of sub-regions.

10. The apparatus according to claim 9, further comprising an image distortion sensor configured to measure distortion of an image projected onto a region substantially at substrate level by the projection system and wherein the actuator controller is configured to set the magnitudes of the set of forces with reference to a calibration table so as to compensate for any image distortion detected by the image distortion sensor.

11. The apparatus according to claim 1, wherein the deformable lens element is substantially rotationally symmetric.

12. The apparatus according to claim 1, wherein the deformable lens actuator is configured to apply tangential bending moments along with (a) forces with a component substantially parallel to the optical axis of the projection system, or (b) radial bending moments, or (c) both (a) and (b).

13. The apparatus according to claim 12, wherein the deformable lens actuator is configured to substantially compensate distortion components having a shape corresponding to one or more of the following Zernike polynomials: Z5, Z6, Z10, Z11, Z17, Z18, Z26, Z27.

14. The apparatus according to claim 13, wherein the deformable lens actuator is configured to apply a combination of tangential bending moments and forces with a component substantially parallel to the optical axis of the projection system.

15. The apparatus according to claim 12, wherein the deformable lens actuator is configured to substantially compensate distortion components having a shape corresponding to one or more of the following Zernike shapes: Z7, Z8, Z12, Z13, Z19, Z20, Z28, Z29.

16. The apparatus according to claim 15, wherein the deformable lens actuator is configured to apply a combination of tangential and radial bending moments.

17. A device manufacturing method, comprising:
controlling a shape of a deformable lens element by transmitting a combination of a net force substantially parallel to the optical axis of the deformable lens element and a localized torque about an axis substantially perpendicular to the optical axis independently at each of a plurality of sub-regions on the deformable lens element; and
projecting a patterned radiation beam through the deformable lens element onto a target portion of a substrate.

* * * * *